(12) United States Patent
Muharemovic et al.

(10) Patent No.: US 11,817,896 B2
(45) Date of Patent: *Nov. 14, 2023

(54) WIDEBAND BALANCED DUPLEXER

(71) Applicant: Apple Inc., Cupertino, CA (US)

(72) Inventors: Nedim Muharemovic, Nuremberg (DE); Joonhoi Hur, Sunnyvale, CA (US); Rastislav Vazny, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/582,872

(22) Filed: Jan. 24, 2022

(65) Prior Publication Data

US 2022/0182079 A1 Jun. 9, 2022

Related U.S. Application Data

(63) Continuation of application No. 17/116,360, filed on Dec. 9, 2020, now Pat. No. 11,265,038.

(51) Int. Cl.
*H04B 1/48* (2006.01)
*H03H 7/42* (2006.01)
*H03F 3/24* (2006.01)

(52) U.S. Cl.
CPC .............. *H04B 1/48* (2013.01); *H03F 3/245* (2013.01); *H03H 7/42* (2013.01); *H03F 2200/294* (2013.01); *H03F 2200/451* (2013.01)

(58) Field of Classification Search
CPC ............... H03F 1/565; H03F 2200/294; H03F 2200/451; H03F 3/19; H03F 3/245; H03H 7/42; H03H 7/463; H04B 1/48
See application file for complete search history.

(56) References Cited

U.S. PATENT DOCUMENTS 8,063,718 B2   11/2011   Ueda et al.
9,094,104 B2   7/2015    Din et al.
(Continued)

FOREIGN PATENT DOCUMENTS

CN   110098849 A   8/2019
CN   110611987 A   12/2019

OTHER PUBLICATIONS

Güner, "Ka-ban Full Duplex System with Electrical Balance Duplexer for 5G Applications using SiGe BiCMOS Technology", Sabanci University, Jul. 31, 2018.
Kumar, "A 2.5-GHz CMOS Full-Duplex Front-End for Asymmetric Data Networks", IEEE Transactions on Circuits and Systems I: Regular Papers (vol. 65, Issue: Oct. 10, 2018).

(Continued)

*Primary Examiner* — Nguyen T Vo
(74) *Attorney, Agent, or Firm* — FLETCHER YODER PC

(57) ABSTRACT

Embodiments disclosed herein relate to isolating a receiver circuit of an electronic device from a transmission signal and leakage of the transmission signal. To do so, an isolation circuit is disposed between the receiver circuit and a transmission circuit. The isolation circuit may include multiple variable impedance devices and one or more antennas. The impedances of the variable impedance devices may be balanced such that a signal at a particular frequency or within a particular frequency band can pass through or is blocked by the isolation circuit. The isolation circuit may include one or more double balanced duplexers to achieve the improved isolation. The isolation circuit may also increase bandwidth available for wireless communications of the electronic device.

20 Claims, 7 Drawing Sheets

(56) References Cited

U.S. PATENT DOCUMENTS

| | | | |
|---|---|---|---|
| 9,154,166 B2 | 10/2015 | Darabi et al. | |
| 10,419,050 B1 * | 9/2019 | Cetinoneri et al. | |
| 11,265,038 B1 * | 3/2022 | Muharemovic | H03F 3/245 |
| 2008/0026689 A1 | 1/2008 | Johnson et al. | |
| 2010/0035563 A1 | 2/2010 | Mikhemar et al. | |
| 2011/0128088 A1 | 6/2011 | Jin et al. | |
| 2013/0057343 A1 * | 3/2013 | Kondo | H03F 3/211 |
| | | | 330/252 |
| 2013/0176914 A1 | 7/2013 | Khlat | |
| 2013/0241670 A1 | 9/2013 | Mikhemar et al. | |
| 2013/0335291 A1 | 12/2013 | Judson et al. | |
| 2018/0123635 A1 * | 5/2018 | Settaf | H04B 1/525 |
| 2019/0238239 A1 | 8/2019 | Laughlin | |

OTHER PUBLICATIONS

Cao, "Enhancing Carrier Aggregation: Design of BAW Quadplexer with Ultrahigh Cross-Band Isolation", IEEE Microwave Magazine, Mar. 3, 2020.

Wang Chao et al. Design and Implementation of 2.4GHz Custom Handheld 2.4GHz (dated Dec. 1, 2018); 3 pgs.

Li Jijun, Design of RF emission front end circuit for P band and L band (dated Aug. 27, 2019); 95 pgs.

Mohammed El-Shennawy et al., "A dual band FMCW radar receiver with integrated active balun and baseband AGC loop"; 2017 IEEE International Symposium on Circuits and Systems (ISCAS), (dated Sep. 28, 2017).

Office Action for Chinese Patent Application No. 202211116575.0 dated Jul. 11, 2023; 6 pgs.

* cited by examiner

WIDEBAND BALANCED DUPLEXER

CROSS-REFERENCE TO RELATED APPLICATION

This application claims priority to and benefit of U.S. patent application Ser. No. 17/116,360, filed Dec. 9, 2020, and entitled "WIDEBAND BALANCED DUPLEXER," which is incorporated herein by reference in its entirety for all purposes.

BACKGROUND

The present disclosure relates generally to wireless communication, and more specifically to isolation of high bandwidth wireless signals between transmitters and receivers in wireless communication devices.

In an electronic device, a transmitter and a receiver may each be coupled to an antenna to enable the electronic device to both transmit and receive wireless signals. The electronic device may include an electrical balanced duplexer (EBD) that isolates the transmitter from received signals of a first frequency range, and isolates the receiver from transmission signals of a second frequency range (e.g., thus implementing frequency division duplex (FDD) operations). In this manner, interference between the transmission and received signals may be reduced when communicating using the electronic device. However, these communications may be negatively impacted by insertion loss resulting from components of the EBD providing less than ideal isolation of the transmission and/or received signals. Moreover, a bandwidth of an EBD or conventional double balanced duplexer may not be sufficient to support high bandwidth (e.g., greater than 10 MHz) operations.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

An aspect of the disclosure provides an electronic device that may have one or more antennas. The electronic device may have transmit circuitry that sends a transmission signal to the one or more antennas and receive circuitry that receives a reception signal from the one or more antennas. The electronic device may have isolation circuitry including a first balun coupled to the one or more antennas and the transmit circuitry may isolate the transmit circuitry from the reception signal. The isolation circuitry may have a second balun coupled to the one or more antennas and the transmit circuitry in parallel with the first balun. The second balun may prevent a leakage signal from the transmit circuitry from entering the receive circuitry.

Another aspect of the disclosure provides radio frequency transceiver circuitry that may have transmit circuitry communicatively coupled to one or more antennas. The radio frequency transceiver circuitry may have receive circuitry communicatively coupled to the one or more antennas. The radio frequency transceiver circuitry may have a first duplexer coupled to and disposed between the receive circuitry and the one or more antennas. The first duplexer may have a first balun transformer and a first set of variable impedance devices coupled to the first balun transformer. The radio frequency transceiver circuitry may have a second duplexer coupled to and disposed between the receive circuitry and the one or more antennas. The second duplexer may have a second balun transformer and a second set of variable impedance devices coupled to the second balun transformer.

Another aspect of the disclosure provides a user equipment including one or more antennas and a power amplifier. The user equipment may have isolation circuitry having a first transformer coupled to and disposed between the power amplifier and the one or more antennas. The isolation circuitry may have a first variable impedance device coupled to the first transformer, and a second variable impedance device coupled to the first transformer. The isolation circuitry may have a second transformer coupled to and disposed between the power amplifier and the one or more antennas. The second transformer may be disposed in parallel with the first transformer. The isolation circuitry may have a third variable impedance device coupled to the second transformer, and a fourth variable impedance device coupled to the second transformer.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
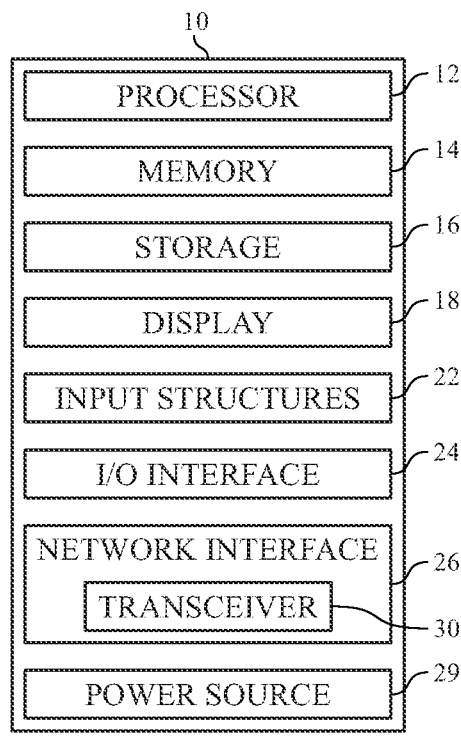
FIG. 1 is a block diagram of an electronic device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the term "approximately," "near," "about", and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on).

This disclosure is directed to isolation of wireless signals between transmitters and receivers in wireless communication devices using a double balanced duplexer (DBD). When using a DBD in an electronic device to isolate a transmitter from received signals and isolate a receiver from transmission signals, variable impedance devices (e.g., impedance gradients, impedance tuners) may be used to place baluns (e.g., transformers) of the DBD in balanced and unbalanced states to block and enable pass-through of signals. For example, an impedance gradient coupled to a balun may function as a filter with a high impedance in a pass band and a low impedance in the block (e.g., stop) band. Conversely, an impedance tuner coupled to the balun may function as a filter with a low impedance in the pass band and a high impedance in the block band. As a result, in the pass band, the balun is unbalanced, and signals having frequencies in the pass band pass through the balun. In the block band, the balun is balanced, and signals are destructively combined at the balun. However, the bandwidth of the pass band of the DBD may be limited (e.g., to about 10 megahertz (MHz)). Further, insertion loss (e.g., lost power) caused by non-ideal components of the DBD operating in real-world conditions may degrade communication capabilities of the DBD.

Embodiments herein provide various apparatuses and techniques to reduce insertion loss while increasing the bandwidth of the DBD and maintaining or improving isolation of the transmitter and receiver of an electronic device. To do so, the embodiments disclosed herein include isolation circuitry that may have a first balun coupled between a transmitter and an antenna that isolates the transmitter from received signals received by the antenna, and enables transmission signals sent from the transmitter to pass through to the antenna. The isolation circuitry may also have a second balun coupled between the transmitter and the antenna that substantially prevents, reduces, or mitigates a leakage signal from the transmitter to a receiver. The isolation circuitry may further include a third balun coupled between the antenna and the receiver that isolates the receiver from the transmission signals, and enables the received signals to pass from the antenna to the receiver. The isolation circuitry may additionally include a fourth balun that substantially prevents, reduces, or mitigates a leakage signal from the antenna to the transmitter.

Each balun may include a set of coils, such as four coils. In some embodiments, one pair of the coils (e.g., on a transmitter side of the balun, on a receiver side of the balun, on an antenna side of the balun) may be coupled to variable impedance devices that are tunable to place the respective balun in a balanced or unbalanced state. In such embodiments, the other pair of coils may not be coupled to such variable impedance devices. However, in some embodiments, each pair of coils of the balun may be coupled to variable impedance devices, such that each pair may operate in the balanced state to enhance isolation of the receiver from transmission signals and/or enhance isolation of the transmitter from received signals.

FIG. 1 is a block diagram of an electronic device 10, according to an embodiment of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including computer code stored on a computer-readable medium) or a combination of both hardware and software elements. The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may represent a block diagram of any suitable computing device, including a desktop computer, a notebook computer, a portable electronic or handheld electronic device (e.g., a wireless electronic device or smartphone), a tablet, a wearable electronic device, and other similar devices. It should be noted that the processor 12 and other related items in FIG.

1 may be generally referred to herein as "data processing circuitry." Such data processing circuitry may be embodied wholly or in part as software, software, hardware, or any combination thereof. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may perform the various functions described herein and below.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. The network interface 26 may include, for example, one or more interfaces for a personal area network (PAN), such as a BLUETOOTH® network, for a local area network (LAN) or wireless local area network (WLAN), such as a network employing one of the IEEE 802.11x family of protocols (e.g., WI-FI®), and/or for a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network. In particular, the network interface 26 may include, for example, one or more interfaces for using a Release-15 cellular communication standard of the 5G specifications that include the millimeter wave (mmWave) frequency range (e.g., 24.25-300 gigahertz (GHz)). The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas (not shown in FIG. 1). In some cases, an impedance of the one or more antennas may disturb the duplex function and degrade isolation between the transmit path and the receive path. To prevent such disruption by the one or more antennas, a variable impedance device, such as an impedance tuner, may be used to substantially match an impedance of the antenna.

In some embodiments, the transceiver 30 may include a duplexer (not shown in FIG. 1). A duplexer enables bidirectional communication over a single path while separating signals traveling in each direction from one another. For example, the duplexer may enable frequency division duplexing (FDD), such that the duplexer may isolate a transmitter of the electronic device 10 from a received signal of a first frequency band while isolating a receiver of the electronic device 10 from a transmission signal of a second frequency band (e.g., isolate the transmitter from the receiver, and vice versa). In some embodiments, the duplexer may include multiple variable impedance devices that isolate the transmitter from a received signal and/or isolates the receiver from a transmission signal. The duplexer may include an electrical balanced duplexer, a double balanced duplexer, or any other suitable form of duplexer.

The power source 29 of the electronic device 10 may include any suitable source of power, such as a rechargeable lithium polymer (Li-poly) battery and/or an alternating current (AC) power converter. In certain embodiments, the electronic device 10 may take the form of a computer, a portable electronic device, a wearable electronic device, or other type of electronic device.

Figure 2:
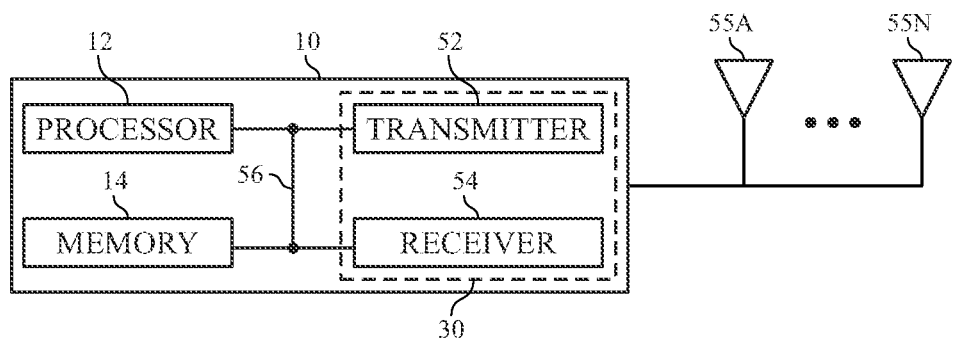
FIG. 2 is a functional block diagram of the electronic device of FIG. 1 that may implement the components shown in FIG. 1 and/or the circuitry and/or components described in the following figures, according to embodiments of the present disclosure.

FIG. 2 is a functional block diagram of the electronic device 10 that may implement the components shown in FIG. 1 and/or the circuitry and/or components described in the following figures, according to embodiments of the present disclosure. As illustrated, the processor 12, the memory 14, the transceiver 30, the transmitter 52, the receiver 54, and/or the antennas 55 (illustrated as 55a-55n) may be communicatively coupled directly or indirectly (e.g., through or via another component, a communication bus, a network) to one another to transmit and/or receive data between one another.

The electronic device 10 may include the transmitter 52 and/or the receiver 54 that respectively enable transmission and reception of data between the electronic device 10 and a remote location via, for example, a network or direction connection associated with the electronic device 10 and an external transceiver (e.g., in the form of a cell, eNB (E-UTRAN Node B or Evolved Node B), base stations, and the like. As illustrated, the transmitter 52 and the receiver 54 may be combined into the transceiver 30. The electronic device 10 may also have one or more antennas 55a through 55n electrically coupled to the transceiver 30. The antennas 55a-55n may be configured in an omnidirectional or directional configuration, in a single-beam, dual-beam, or multi-beam arrangement, and so on. Each antenna 55 may be associated with a one or more beams and various configurations. In some embodiments, each beam, when implement as multi-beam antennas, nay have its own transceiver 30. The electronic device 10 may include (not shown) multiple transmitters, multiple receivers, multiple transceivers, and/or multiple antennas as needed for various communication standards.

The transmitter 52 may be configured to wirelessly transmit packets having different packet types or functions. For example, the transmitter 52 may be configured to transmit packets of different types generated by the processor 12. The receiver 54 may be configured to wirelessly receive packets having different packet types. In some examples, the receiver 54 may be configured to detect a type of a packet used and to process the packet accordingly. In some embodiments, the transmitter 52 and the receiver 54 may be configured to transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

As mentioned above, the transceiver 30 of the electronic device 10 may include a transmitter and a receiver that are coupled to at least one antenna to enable the electronic device 10 to transmit and receive wireless signals. The electronic device 10 may include isolation circuity having one or more baluns coupled to multiple variable impedance devices that isolate the transmitter from received signals, and the receiver from transmission signals, thus reducing interference when communicating. In particular, a pair of variable impedance devices coupled to a balun may be tuned to a balanced state to block signals of a certain frequency range (e.g., a block band) from passing through, and may be tuned to an unbalanced state to enable signals of another frequency range (e.g., a pass band) to pass through. However, the transmission path for transmission signals sent from the transmitter may branch from the antenna toward the receiver. Accordingly, the branched transmission signal that travels in the direction of the receiver may be a leakage signal that can interfere with signals received by the antenna. Further, in some cases, a portion of the signals received by the antennas may branch toward the transmitter. The branched received signal that travels in the direction of the transmitter may be an additional or alternative leakage signal that can interfere with signals to be transmitted via the antenna.

Embodiments herein provide various apparatuses and techniques to reduce or substantially prevent such interference by maintaining isolation of the transmitter and receiver of the electronic device 10. To do so, the embodiments disclosed herein include isolation circuitry that may have a first balun coupled between the transmitter and the antenna that isolates the transmitter from received signals received by the antenna, and enables transmission signals sent from the transmitter to pass through to the antenna. The isolation circuitry may also have a second balun coupled between the transmitter and the antenna that substantially prevents, reduces, or mitigates a leakage signal from the transmitter to a receiver. The isolation circuitry may further include a third balun coupled between the antenna and the receiver that isolates the receiver from the transmission signals, and enables the received signals to pass from the antenna to the receiver. The isolation circuitry may additionally include a fourth balun that substantially prevents, reduces, or mitigates a leakage signal from the antenna to the transmitter.

Each balun may include a set of coils, such as four coils. In some embodiments, one pair of the coils (e.g., on a transmitter side of the balun, on a receiver side of the balun, on an antenna side of the balun) may be coupled to variable impedance devices that are tunable to place the respective balun in a balanced or unbalanced state. In such embodiments, the other pair of coils may not be coupled to such variable impedance devices. However, in some embodiments, each pair of coils of the balun may be coupled to variable impedance devices, such that each pair may operate in the balanced state to enhance isolation of the receiver from transmission signals and/or enhance isolation of the transmitter from received signals.

Figure 3:
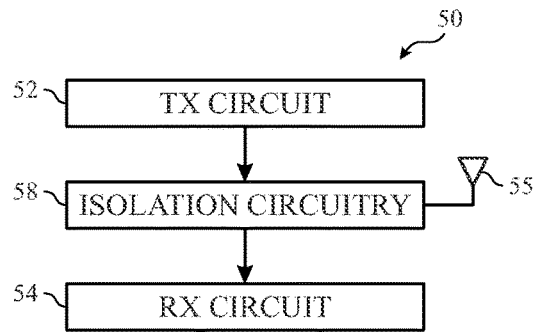
FIG. 3 is a block diagram of example transceiver circuitry of the electronic device of FIG. 1, according to an embodiment of the present disclosure.

FIG. 3 is a block diagram of example transceiver circuitry 50 of the electronic device 10, according to an embodiment of the present disclosure. In some embodiments, the example transceiver circuitry 50 may be disposed in the transceiver 30 discussed with respect to FIG. 1. In other embodiments, the transceiver circuitry 50 may be disposed in the network interface 26 and coupled to the transceiver 30.

As illustrated, the transceiver circuitry 50 includes an isolation circuit 58 disposed between a transmit (TX) circuit 52 and a receive (RX) circuit 54. The isolation circuit 58 is communicatively coupled to the TX circuit 52 and the RX circuit 54. In some embodiments, the isolation circuit 58 is coupled to one or more antennas 55. In some alternative embodiments, the one or more antennas 55 may be disposed within the isolation circuit 58. The isolation circuit 58 enables signals (e.g., transmission signals) of a first frequency range from the TX circuit 52 to pass through to the one or more antennas 55 and blocks the signals of the first frequency range from passing through to the RX circuit 54. The isolation circuit 58 also enables signals (e.g., received signals) of a second frequency range received via the one or more antennas 55 to pass through to the RX circuit 54 and blocks the received signals of the second frequency range from passing through to the TX circuit 52. Each frequency range may be of any suitable bandwidth greater than about 10 MHz, such as between 1 and 100 gigahertz (GHz) (e.g., 10 megahertz (MHz)), and include any suitable frequencies. For example, the first frequency range (e.g., the TX frequency range) may be between 880 and 890 MHz, and the second frequency range (e.g., the RX frequency range) may be between 925 and 936 MHz.

In some embodiments, the isolation circuit 58 isolates the RX circuit 54 from a transmission (TX) signal generated by the TX circuit 52. For example, when transmitting a TX signal, some of the TX signal (e.g., a TX leakage signal) may propagate toward the RX circuit 54. If a frequency of the TX leakage signal is within the RX frequency range (e.g., is a frequency supported by the RX circuit 54), the TX leakage signal may interfere with an RX signal and/or the RX circuit 54. To prevent such interference, the isolation circuit 58 may isolate the RX circuit 54 from the TX leakage signal.

In additional or alternative embodiments, the isolation circuit 58 isolates the TX circuit 52 from a received (RX)

signal received via the one or more antennas 55. For example, when receiving an RX signal from the one or more antennas 55, some of the RX signal (e.g., an RX leakage signal) may propagate toward the TX circuit 52. If a frequency of the RX leakage signal is within the TX frequency range (e.g., is a frequency supported by the TX circuit 52), the RX leakage signal may interfere with the TX signal and/or the TX circuit 52. To prevent such interference, the isolation circuit 58 may isolate the TX circuit 52 from the RX leakage signal.

Figure 4A:
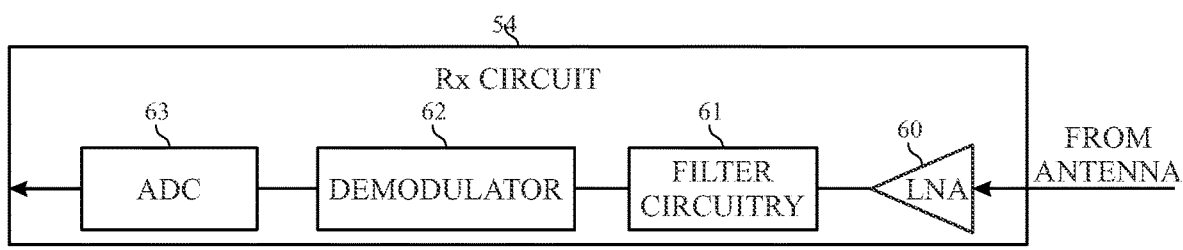
FIG. 4A is a schematic diagram of a receiver circuit of the example transceiver circuitry of FIG. 3, according to an embodiment of the present disclosure.

FIG. 4A is a schematic diagram of the receive circuit (e.g., the RX circuit) 54, according to an embodiment of the present disclosure. As illustrated, the RX circuit 54 may include, for example, a low noise amplifier (LNA) 60, filter circuitry 61, a demodulator 62, and an analog-to-digital converter (ADC) 63. One or more signals received by the one or more antennas 55 may be sent to the RX circuit 54 via the isolation circuit 58. In some embodiments, the RX circuit 54 may include components in addition to or alternative to the LNA 60, filter circuitry 61, the demodulator 62, and the ADC 63, such as a mixer, a digital down converter, and the like.

The LNA 60 and filter circuitry 61 may receive the RX signal received by the one or more antennas 55. The LNA 60 may amplify the RX signal to a suitable level for the rest of the circuitry to process. The filter circuitry 61 may include one or more types of filters such as bandpass filter, a low pass filter, or a decimation filter, or any combination thereof. The filter circuitry 61 may remove undesired noise from the RX signal, such as cross-channel interference. The filter circuitry 61 may also remove additional signals received by the one or more antennas 55 which are at frequencies other than the desired signal. The filtered RX signal is sent to the demodulator 62. The demodulator 62 may remove the RF envelope and extract a demodulated signal from the filtered RX signal for processing. The ADC 63 receives the demodulated analog signal and converts the signal to a digital signal so that it can be further processed by the electronic device 10.

Figure 4B:
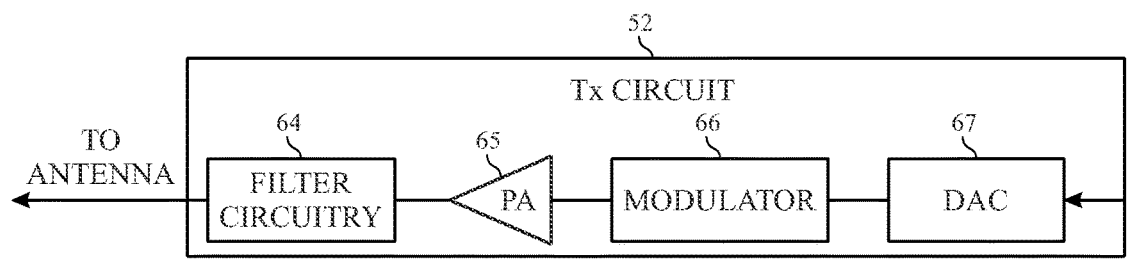
FIG. 4B is a schematic diagram of a transmitter circuit of the example transceiver circuitry of FIG. 3, according to an embodiment of the present disclosure.

FIG. 4B is a schematic diagram of the transmission circuit (e.g., the TX circuit) 52, according to an embodiment of the present disclosure. As illustrated, the TX circuit 52 may include, for example, filter circuitry 64, a power amplifier (PA) 65, a modulator 66, and a digital-to-analog converter (DAC) 67. In some embodiments, the TX circuit 52 may include components in addition to or alternative to the filter circuitry 64, the PA 65, the modulator 66, and the DAC 67 such as a digital up converter, etc.

A digital signal containing information to be transmitted via the one or more antennas 55 is provided to the DAC 67. The DAC 67 converts the digital signal to an analog signal. The modulator 66 may combine the converted analog signal with a carrier signal to generate a radio wave. The PA 65 receives signal the modulated signal from the modulator 66. The PA 65 amplifies the modulated signal to a suitable level to drive transmission of the signal via the one or more antennas 55. Similar to the filter circuitry 61, the filter circuitry 64 of the TX circuit 52 may remove undesirable noise from the amplified signal to be transmitted via the one or more antennas 55.

Figure 5:
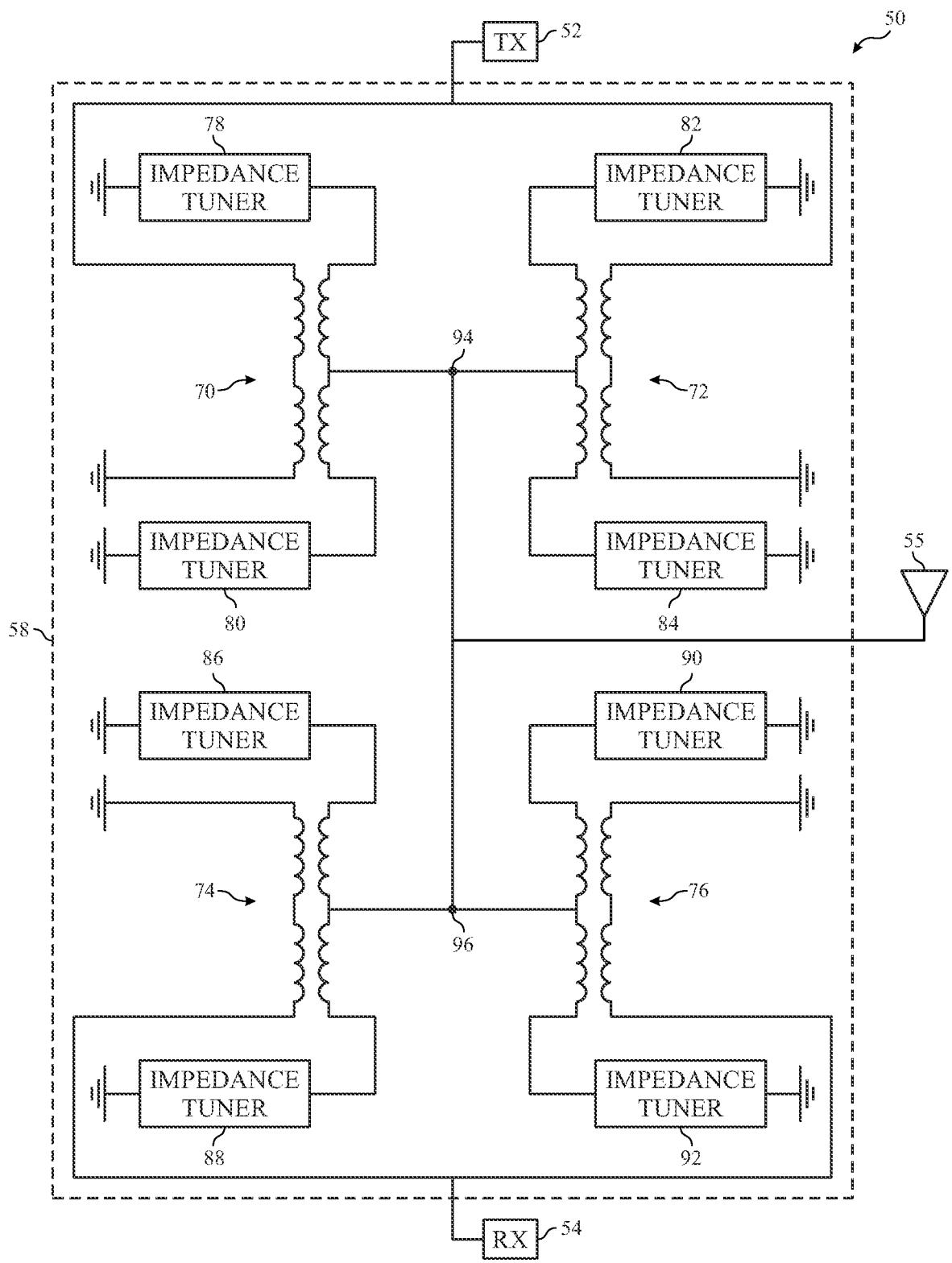
FIG. 5 is a schematic diagram of the example transceiver circuitry of FIG. 3 having baluns to isolate the transmitter/receiver circuits from received/transmission signals and baluns to reduce insertion loss, according to an embodiment of the present disclosure.

FIG. 5 is a schematic diagram of the transceiver circuitry 50 of FIG. 3 having baluns (e.g., 70, 72) to isolate the transmitter/receiver circuits from received/transmission signals and baluns (e.g., 74, 76) to reduce insertion loss, according to an embodiment of the present disclosure. As illustrated, the isolation circuitry 58 two baluns 70, 72 disposed in parallel between the TX circuit 52 and the one or more antennas 55, and two baluns 74, 76 disposed in parallel between the RX circuit 54 and the one or more antennas 55. The baluns 70, 72 are coupled to the one or more antennas 55 via a first node 94, and the two baluns 74, 76 are coupled to the one or more antennas 55 via a second node 96.

Variable impedance devices 78, 80, 82, 84, 86, 88, 90, 92 are coupled to each of the baluns 70, 72, 74, 76. As illustrated, the variable impedance devices 78, 80 are coupled to the balun 70, the variable impedance devices 82, 84 are coupled to the balun 72, the variable impedance devices 86, 88 are coupled to the balun 74, and the variable impedance devices 90, 92 are coupled to the balun 76. In some embodiments, the variable impedance devices 78, 80, 82, 84, 86, 88, 90, 92 may be implemented as impedance tuners, impedance gradients, or both.

An impedance gradient, such as the variable impedance device 78, may operate as an impedance switch, and provide a first impedance state (e.g., a lower impedance) in a first operating mode and a second impedance state (e.g., a higher impedance than the first impedance state) in a second operating mode. For example, the first impedance state may approach or appear as a short or closed circuit (e.g., approaching or approximately equal to zero ohms, such as between 0 and 100 ohms, 0.1 and 10 ohms, 0.5 and 2 ohms, and so on), while the second impedance state may approach or appear as an open circuit (e.g., providing an impedance greater than the first impedance state, such as greater than 10000 ohms, greater than 1000 ohms, greater than 100 ohms, greater than 10 ohms, greater than 5 ohms, and so on). The impedance gradient may be made of any suitable circuit components that enable the first and second impedance states, such as, for example, any suitable combination of inductors and capacitors.

An impedance tuner, such as the variable impedance device 80, may operate as a tunable impedance device, and provide multiple impedance states. For example, the impedance states may include a first impedance state approaching or appearing as a short or closed circuit (e.g., approaching or approximately equal to zero ohms, such as between 0 and 100 ohms, 0.1 and 10 ohms, 0.5 and 2 ohms, and so on), a second impedance state approaching or appearing as an open circuit (e.g., providing an impedance greater than the first impedance state, such as greater than 50000 ohms, such as greater than 10000 ohms, greater than 1000 ohms, greater than 100 ohms, greater than 10 ohms, greater than 5 ohms, and so on), and multiple states providing impedances (e.g., between 0 and 50000 ohms) in between the first and second impedance states. An impedance tuner may be made of any suitable circuit components that enable the multiple impedance states, such as, for example, any suitable combination of inductors and capacitors. It should be understood that these impedance devices are provided as examples, and any suitable device that provides different impedance states and/or values, such as an impedance switch or variable impedance device, is contemplated.

Each variable impedance device (e.g., 78, 82, 86, 90 is paired with a corresponding variable impedance device (e.g., 80, 84, 88, 92). That is, the variable impedance device 78 is paired with the variable impedance device 80, the variable impedance device 82 is paired with the variable impedance device 84, the variable impedance device 86 is paired with the variable impedance device 88, and the variable impedance device 90 is paired with the variable impedance device 92. These pairs of variable impedance devices can be balanced (or unbalanced) to block (or enable) a signal to pass therethrough. Advantageously, blockage of a signal (e.g., isolation provided by the pairs of variable impedance devices) may be independent of an impedance mismatch of the one or more antennas 55. That is, the impedance of the one or more antennas 55 may not affect the effectiveness of blocking a signal resulting from placing a pair of variable impedance devices in a balanced state.

The balun 70 may isolate the TX circuit 52 from the RX signal when the corresponding variable impedance devices 78, 80 are in a balanced state for a reception frequency (e.g., a frequency supported by the RX circuit 54) of the RX signal. That is, the variable impedance devices 78, 80 may block the RX signal from passing through to the TX circuit 52 when the impedances of the variable impedance devices 78, 80 are in a balanced state (e.g., correlate or approximately match in impedance). At the same time, the balun 70 may enable the TX signal to pass therethrough from the TX circuit 52 to the one or more antennas 55 when the corresponding variable impedance devices 78, 80 are in an unbalanced state (e.g., not correlate or approximately match in impedance) for a transmission frequency (e.g., a frequency supported by the TX circuit 52) of the TX signal.

Additionally, the balun 72 may substantially prevent (e.g., mitigate or reduce an occurrence of) a TX leakage signal from the TX circuit 52 to the RX circuit 54 by reducing or cancelling the TX leakage signal. For example, the balun 70 may generate the TX leakage signal. The balun 72 may generate a TX leakage cancellation signal that is equal and opposite to (e.g., equal in amplitude and opposite in phase) the TX leakage signal generated by the balun 70. In some embodiments, to generate the cancellation signal, the balun 72 may be configured in an opposite polarity from the balun 70. Thus, the TX leakage signal generated by the balun 72 destructively combines with the TX leakage cancellation signal generated by the balun 72, effectively cancelling the TX leakage signal generated by the balun 70 and substantially preventing the TX leakage signal generated by the balun 70 from propagating to the baluns 74, 76.

Similarly, the balun 76 may substantially prevent (e.g., mitigate or reduce) an RX leakage signal generated by the balun 74 by generating an RX leakage cancellation signal that is equal and opposite to (e.g., equal in amplitude and opposite in phase) the RX leakage signal generated by the balun 74. In some embodiments, to generate the cancellation signal, the balun 76 may be configured in an opposite polarity from the balun 74. The RX leakage signal generated by the balun 76 destructively combines with the RX leakage cancellation signal generated by the balun 74, effectively cancelling the RX leakage signal generated by the balun 74 and substantially preventing the RX leakage signal generated by the balun 74 from propagating to the baluns 70, 72. Thus, the baluns 70, 72, 74, 76 may prevent or mitigate (or reduce an occurrence of) interference between the TX and RX signals while reducing an occurrence of damage to the TX circuit 52 and the RX circuit 54. As discussed above, the baluns 72, 76 may improve isolation effectiveness of the isolation provided by the baluns 70, 74 of the RX circuit 54 from the TX signal and isolation of the TX circuit 52 from the RX signal received via the one or more antennas 55.

That is, the balun 70 may isolate the TX circuit 52 from the RX signal while the balun 72 may substantially prevent (or mitigate) a leakage signal (e.g., leakage from the TX signal) from the TX circuit 52 to the RX circuit 54. Similarly, the balun 74 isolates the RX circuit 54 from the TX signal while the balun 76 substantially prevents (or substantially reduce an occurrence of) an RX leakage signal (e.g., leakage from the RX signal) from the one or more antennas 55 to the TX circuit 52 by cancelling the RX leakage signal.

During operation, a combination of the baluns 72, 76 and corresponding variable impedance devices 82, 84, 90, 92 (e.g., without the baluns 70, 74 and corresponding variable impedance devices 78, 80, 86, 88) may function similar to a double-balanced duplexer (e.g., without the baluns 70, 74). Similarly, a combination of the baluns 70, 74 and corresponding variable impedance devices 78, 80, 86, 88 (e.g., without the baluns 72, 76 and corresponding variable impedance devices 82, 84, 90, 92) may function similar to a double-balanced duplexer. However, as discussed above, each combination of the baluns 70, 74 or 72, 76 may not have sufficient bandwidth to support high bandwidth operation due to the relatively large insertion loss caused by the baluns 70, 74 or 72, 76.

In combination, the baluns 70 with 72 and/or 74 with 76 (and corresponding variable impedance devices) may increase the bandwidth of the transceiver circuitry 50 by reducing or mitigating the leakage signals. That is, the baluns 70, 72 (and corresponding variable impedance devices) may enable a bandwidth of the TX signal of the transceiver circuitry 50 to be greater than 10 MHz, such as between 10 MHz and 1 gigahertz (GHz) (e.g., 300 MHz). Similarly, the baluns 74, 76 may enable a bandwidth of the RX signal of the transceiver circuitry 50 to be greater than 10 MHz, such as between 10 MHz and 1 gigahertz (GHz) (e.g., 300 MHz). That is, the baluns 70, 72, 74, 76 may enable transmission of a TX signal via the one or more antennas within a frequency range of greater than 10 MHz and block a reception signal within a frequency range of greater than 10 MHz from passing through to the TX circuit 52. In some embodiments, the frequency range of the transmitted TX signal and a blocked RX signal may be greater than 100 MHz, greater than about 200 MHz, and the like. Accordingly, the baluns 70, 72, 74, 76 improve effectiveness of the isolation of the RX circuit 54 from the TX signal transmitted by the TX circuit 52 and isolation of the TX circuit 52 from the RX signal received via the one or more antennas 55. Thus, the transceiver circuitry 50 may support increased data transfer speeds, reduce an occurrence of interference between the TX and RX signals, and reduce an occurrence of damage caused to the TX circuit 52 and the RX circuit 54 due to signal leakage. While the transceiver circuitry 50 is illustrated in FIG. 5 including baluns 70, 72, 74, 76, it should be understood that any suitable isolation circuitry can be used to isolate the RX circuit 54 from the TX signal (and TX noise signal) transmitted by the TX circuit 52 and isolate the TX circuit 52 from the RX signal (and RX noise signal) received via the one or more antennas 55.

Figure 6:
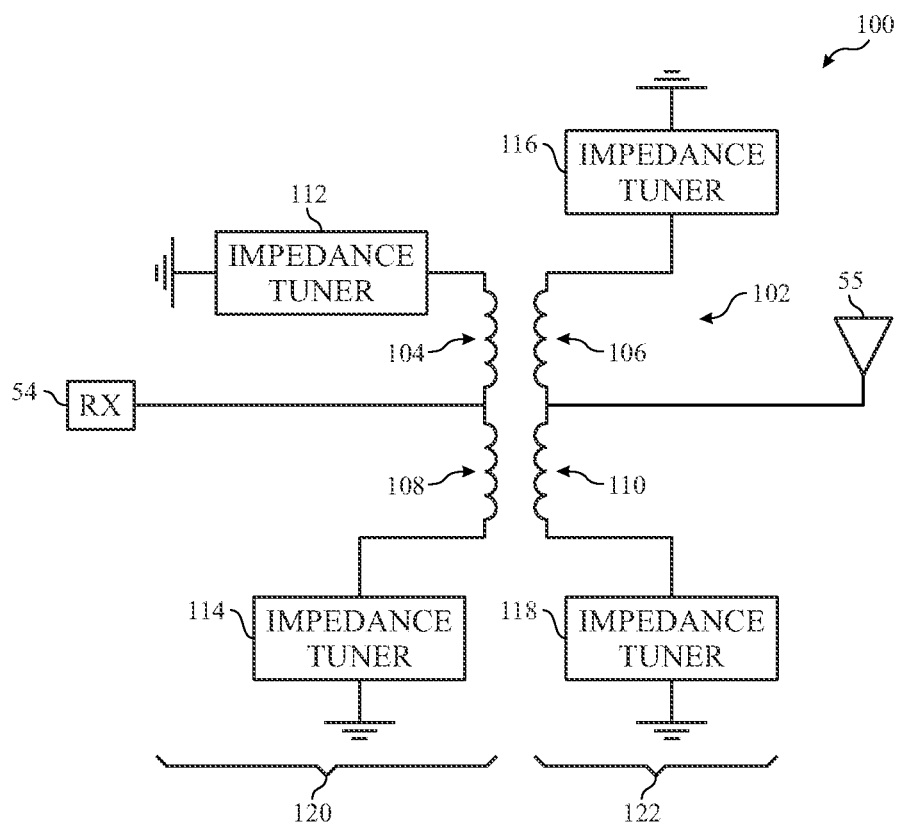
FIG. 6 is a schematic diagram of an example duplexer of the transceiver circuitry of FIG. 3 having additional variable impedance devices to enhance isolation, according to an embodiment of the present disclosure.

FIG. 6 is a schematic diagram of an example duplexer 100 of the transceiver circuitry 50 of FIG. 3 having additional variable impedance devices to enhance isolation, according to an embodiment of the present disclosure. The duplexer 100 is similar to the baluns 70, 72, 74, 76 of the transceiver circuitry of FIG. 5, with additional variable impedance devices coupled to each coil of a balun 102. In some embodiments, the transceiver circuitry 50 of FIG. 5 may be implemented by replacing any or all of the baluns 70, 72, 74, 76 and corresponding variable impedance devices 78, 80, 82, 84, 86, 88, 90, 92 with the duplexer 100 and corresponding variable impedance devices 112, 114, 116, 118 of FIG. 6. As illustrated, the duplexer 100 may be disposed between and communicatively coupled to the RX circuit 54 and the one or more antennas 55. In additional or alternative embodiments, the duplexer 100 may be disposed between and communicatively coupled to the TX circuit 52 and the one or more antennas 55. The duplexer 100 includes the balun 102 and a number of variable impedance devices 112, 114, 116, 118 coupled to the balun 102. The variable impedance devices 112, 114, 116, 118 may be implemented as impedance tuners, impedance gradients, LC matching networks, or a combination thereof.

A first side 120 of the balun 102 includes a first set of coils (windings) 104, 108 coupled to the RX circuit 54. A first variable impedance device 112 and a second variable impedance device 114 are coupled to opposing ends of the first set of coils 104, 108. The RX circuit 54 is coupled to a first variable impedance device 112 via a first coil 104 of the first set of coils and coupled to a second variable impedance device 114 via a second coil 108 of the first set of coils.

A second side 122 of the balun 102 includes a second set of coils 106, 110 coupled to the one or more antennas 55. A third variable impedance device 116 and a fourth variable impedance device 118 are coupled to opposing ends of the second set of coils 104, 108. The one or more antennas 55 is coupled to a third variable impedance device 116 via a third coil 106 of the second set of coils and coupled to a fourth variable impedance device 118 via a fourth coil 110 of the second set of coils.

During operation, the third variable impedance device 116 may have a low impedance in the pass band of the RX frequency and a high impedance in the block band of the RX frequency. The fourth variable impedance device 118 may have a high impedance in the pass band and a high impedance in the block band of the RX frequency. That is, the third variable impedance device 116 and the fourth variable impedance device are in an unbalanced state in the pass band and in a balanced state in the block band. The unbalanced state enables pass-through of signals having a frequency in the pass band. Similarly, the balanced state blocks signals having a frequency in the block band. The first variable impedance device 112 may have a high impedance in the pass band and a high impedance in the block band, of the RX frequency. The second variable impedance device 114 may have a low impedance in the pass band and a high impedance in the block band. That is, the first variable impedance device 112 and the second variable impedance device 114 are in an unbalanced state in the pass band an in a balanced state in the block band, of the RX frequency.

While the duplexer 100 is illustrated to include the balun 102 disposed between the RX circuit 54 and the one or more antennas 55, it should be understood that other arrangements are possible. For example, the duplexer 100 may be disposed between the TX circuit 52 and the one or more antennas 55. That is, the RX circuit 54 in FIG. 6 may be replaced by the TX circuit 52. In that case, the first variable impedance device 112 and the third variable impedance device 116 may be open and the second variable impedance device 114 and the fourth variable impedance device 118 may be closed, at the frequency of the TX signal. That is, the first and third variable impedance devices 112, 116 may have a high impedance in the pass band of the TX frequency and the second and fourth variable impedance devices 114, 118 may have a low impedance at the TX frequency.

The duplexer 100 provides additional isolation between the RX signal and the TX circuit 52 and between the TX signal and the RX circuit 54 when both the first side 120 and the second side 122 of the balun 102 are in a balanced state. Advantageously, the substantial balancing of the impedances in the transceiver circuitry 50 (e.g., the substantial equivalence of the impedance ratios) provides an improved isolation of the RX circuit 54 from the TX signal and improved isolation of the TX circuit 52 from the RX signal. The improved isolation provided by the duplexer 100 is discussed in more detail with respect to FIG. 7 below.

Figure 7:
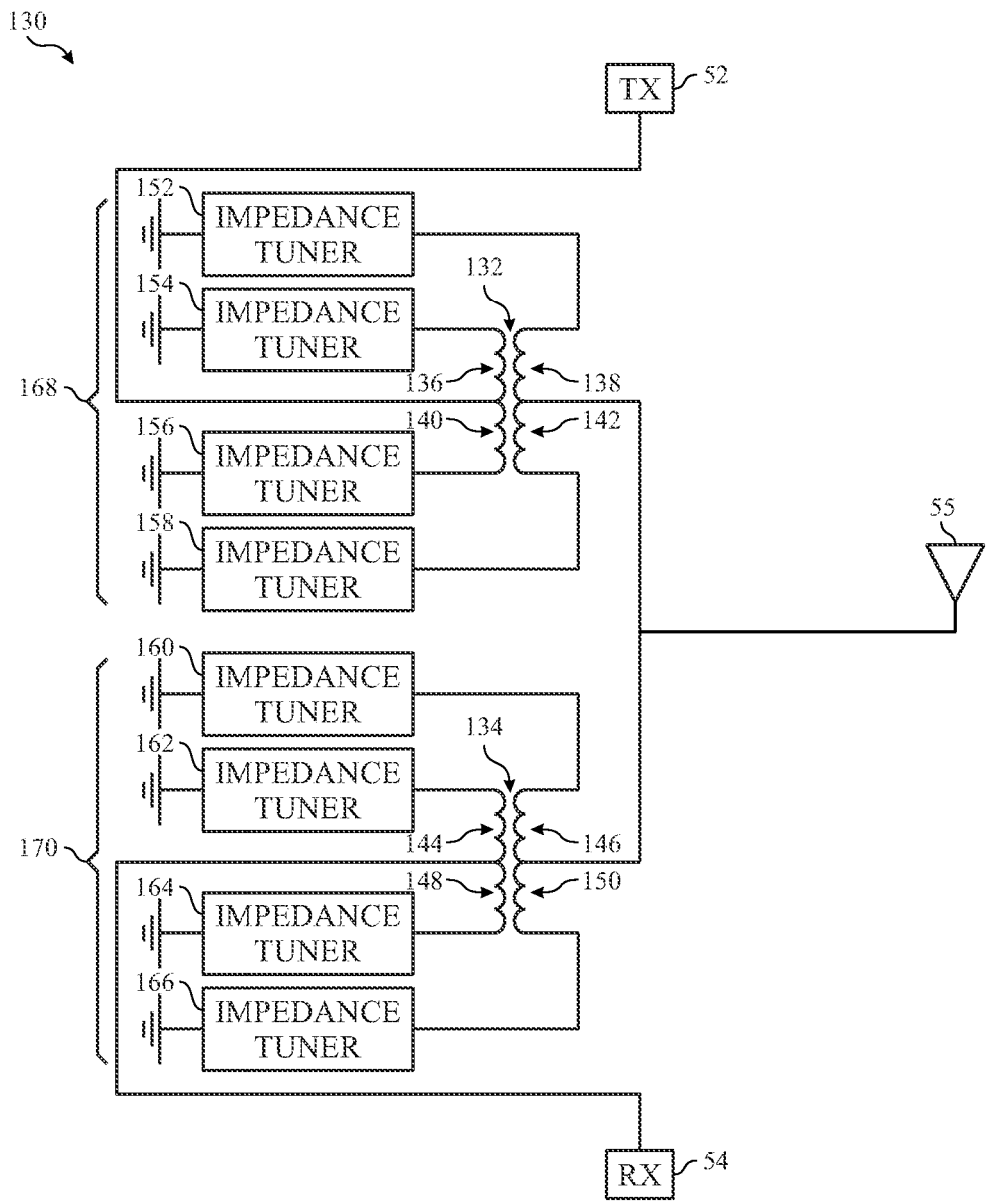
FIG. 7 is a schematic diagram of an example double balanced duplexer implemented with the duplexer of FIG. 6, according to an embodiment of the present disclosure.

FIG. 7 is a schematic diagram of an example double balanced duplexer (DBD) 130 implemented with the duplexer 100 of FIG. 6, according to an embodiment of the present disclosure. The DBD 130 includes a first duplexer 168 and a second duplexer 170. The first duplexer 168 and the second duplexer 170 are substantially similar to the duplexer 100 discussed with respect to FIG. 6. As illustrated, the first duplexer 168 is disposed between the TX circuit 52 and the one or more antennas 55. The second duplexer 170 is disposed between the RX circuit 54 and the one or more antennas 55.

The first duplexer 168 includes a balun 132 having a first set of coils 136, 140 and a second set of coils 138, 142. A first variable impedance device 154 is coupled to a first coil 136 of the first set of coils and a second variable impedance device 156 is coupled to a second coil 140 of the first set of coils. That is, the first variable impedance device 154 and the second variable impedance device 156 are coupled to opposite ends of the first set of coils 136, 140. Similarly, a third variable impedance device 152 is coupled to a third coil 138 of the second set of coils and a fourth variable impedance device 158 is coupled to a fourth coil 142 of the second set of coils. That is, the third variable impedance device 152 and the fourth variable impedance device 158 are coupled to opposite ends of the second set of coils 138, 142.

The second duplexer 170 includes a balun 134 having a first set of coils 144, 148 and a second set of coils 146, 150. A fifth variable impedance device 162 is coupled to a first coil 144 of the first set of coils and a sixth variable impedance device 164 is coupled to a second coil 148 of the first set of coils. That is, the fifth variable impedance device 162 and the sixth variable impedance device 164 are coupled to opposite ends of the first set of coils 144, 148. Similarly, a seventh variable impedance device 160 is coupled to a third coil 146 of the second set of coils and an eighth variable impedance device 166 is coupled to a fourth coil 150 of the second set of coils. That is, the seventh variable impedance device 160 and the eighth variable impedance device 166 are coupled to opposite ends of the second set of coils 146, 150.

As discussed with respect to the duplexer 100 in FIG. 6, each of the duplexers 168, 170 may operate in a balanced or unbalanced state depending on the frequency ranges of the TX signal and RX signal. That is, the first duplexer 168 may provide isolation of the TX circuit 52 from the RX signal in the RX frequency range when the balun 132 is in a balanced state. Similarly, the second duplexer 170 may provide isolation of the RX circuit from the TX signal (e.g., leakage of the TX signal) in the TX frequency range when the balun 134 is in a balanced state. In some embodiments, the DBD 130 is tunable by changing an impedance of one or more of the variable impedance devices 152, 154, 156, 158, 160, 162, 164, 166.

The variable impedance devices 154, 156 provide isolation of the TX circuit from the RX signal and the variable impedance devices 152, 158 provide additional isolation of the TX circuit 52 from the RX signal. Similarly, the variable impedance devices 160, 166 provide isolation of the RX circuit from the TX signal and the variable impedance devices 162, 164 provide additional isolation of the RX circuit 54 from the TX signal. Thus, the first duplexer 168 (e.g., the balun 132 and the variable impedance devices 152, 154, 156, 158) improves isolation between the RX signal and the TX circuit 52 and the second duplexer 170 (e.g., the balun 134 and the variable impedance devices 160, 162, 164, 166) improves isolation between the TX signal (and TX signal leakage) and the RX circuit 54. Further, the DBD 130 provides an increases bandwidth available for the TX signal to greater than 10 MHz, such as about 100 MHz, compared to a conventional DBD with a single impedance device on each side of the baluns.

Figure 8:
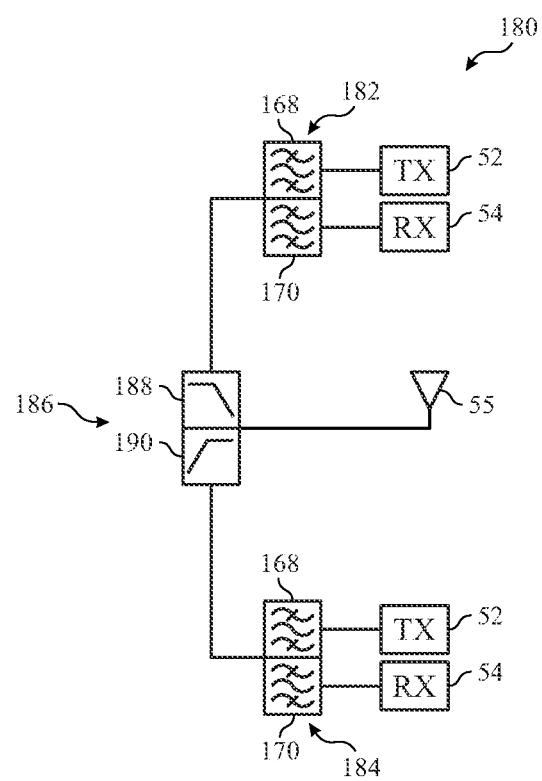
FIG. 8 is a schematic diagram of an example quadplexer module of the transceiver circuitry of the electronic device of FIG. 1, according to an embodiment of the present disclosure.

FIG. 8 is a schematic diagram of an example quadplexer module 180 of the transceiver circuitry 50 of the electronic device of FIG. 1, according to an embodiment of the present disclosure. The quadplexer module 180 may split one input signal into four output signals. In particular, the quadplexer module 180 may route an RX signal received via the one or more antennas 55 to multiple RX circuits 54. Similarly, the quadplexer module 180 may route TX signals from multiple TX circuits 52 to the one or more antennas 55. As illustrated, the quadplexer module 180 includes a quadplexer 186 coupled to a first DBD 182 and a second DBD 184. The first DBD 182 and the second DBD 184 may be substantially similar to the DBD 130 discussed with respect to FIG. 7. That is, each of the first DBD 182 and the second DBD 184 include the first duplexer 168 and the second duplexer 170 discussed with respect to FIG. 7. As illustrated, the first DBD 182 and the second DBD 184 are coupled to a common set of (e.g., one or more) antennas 55. In some embodiments, each of the first DBD 182 and the second DBD 184 may be coupled to separate antennas among the antennas 55.

As discussed above, the first DBD 182 and the second DBD 184 may be tunable by adjusting an impedance of the variable impedance devices 152, 154, 156, 158, 160, 162, 164, 166. In some embodiments, in addition to or in the alternative of the first DBD 182 and the second DBD 184 being tunable, the quadplexer module 180 may include additional DBDs to enable further increase bandwidth available for the TX signal and the RX signal.

In operation, the quadplexer 186 may receive RX signals from the one or more antennas 55 in different frequency bands to be sent to respective RX circuits 54. The quadplexer 186 may also receive TX signals in different frequency bands from respective TX circuits 52 and route the TX signals to the one or more antennas 55. In some embodiments, each of the frequency bands of the various RX signals and TX signals may each be different. In additional or alternative embodiments, at least some of the frequency bands of the various RX signals and TX signals may overlap. As discussed below with respect to FIG. 9, the quadplexer 186 may function as a tunable filter to enable transmission and/or receipt of signals having various frequencies or frequency bands. Similarly, the quadplexer may be tunable to block transmission and/or receipt of signals having various frequencies or frequency bands. Thus, the quadplexer 186 enables improved isolation within the transceiver circuitry 50 discussed with respect to FIG. 3.

Figure 9:
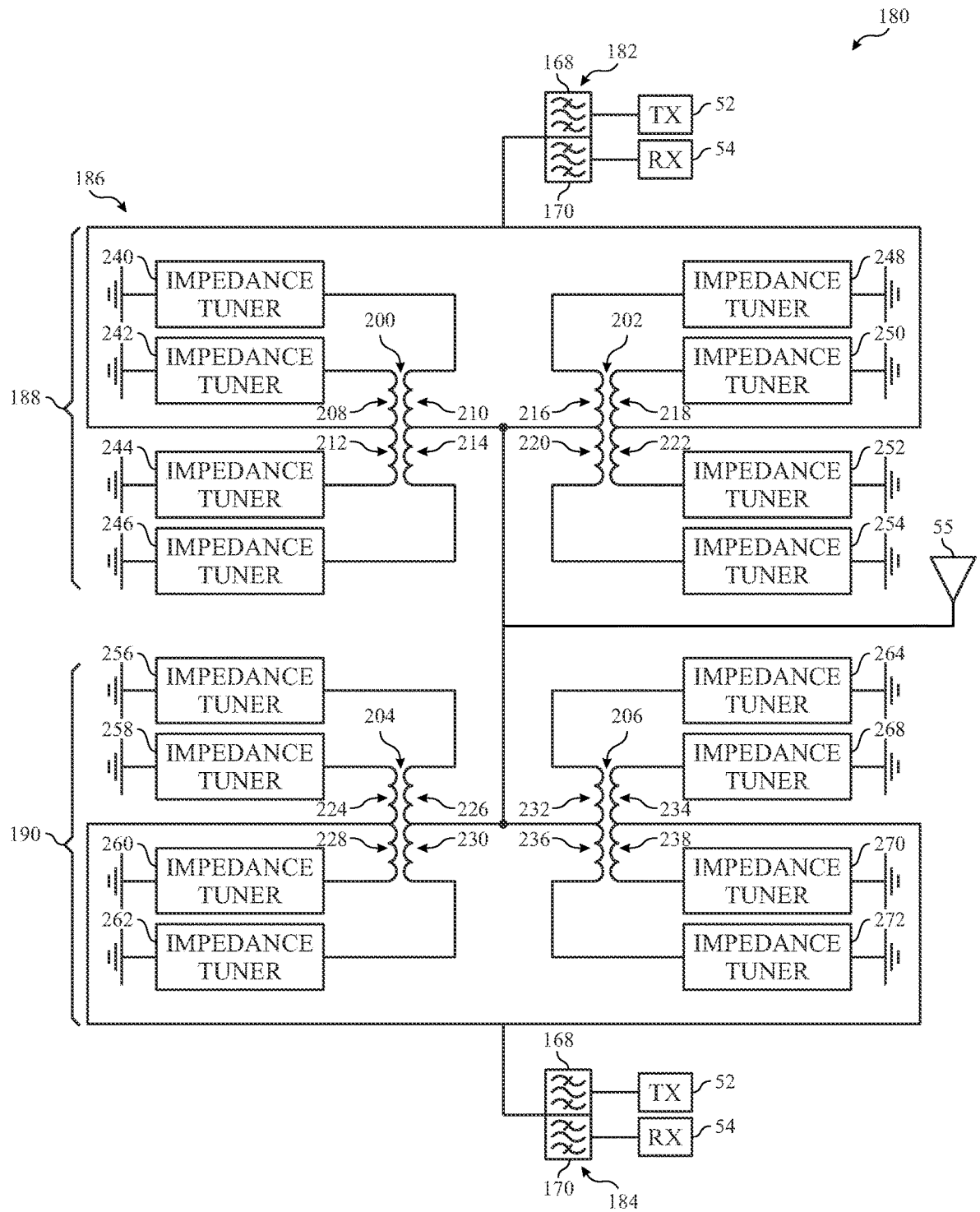
FIG. 9 is a schematic diagram illustrating example components of the example quadplexer module of FIG. 8, according to an embodiment of the present disclosure.

FIG. 9 is a schematic diagram illustrating example components of the example quadplexer module 180 of FIG. 8, according to an embodiment of the present disclosure. As illustrated, the quadplexer 186 includes first isolation circuitry 188 coupled to and disposed between the first DBD 182 and the one or more antennas 55. The quadplexer 186 also includes second isolation circuitry 190 coupled to and disposed between the second DBD 184 and the one or more antennas 55.

The first isolation circuitry 188 includes a first balun 200 coupled in parallel to a second balun 202. The first balun 200 includes a first set of coils 208, 212 and a second set of coils 210, 214. A first variable impedance device 242 is coupled to a first coil 208 of the first set of coils and a second variable impedance device 244 is coupled to a second coil 212 of the first set of coils. That is, the first variable impedance device 242 and the second variable impedance device 244 are coupled to opposite ends of the first set of coils 208, 210. Similarly, a third variable impedance device 240 is coupled to a third coil 210 of the second set of coils and a fourth variable impedance device 246 is coupled to a fourth coil 214 of the second set of coils. That is, the third variable impedance device 240 and the fourth variable impedance device 246 are coupled to opposite ends of the second set of coils 210, 214.

The first balun 200, in conjunction with the third variable impedance device 240 and the fourth variable impedance device 246, may provide isolation between the first DBD 182 and signals from and to the second DBD 184. The first balun 200, in conjunction with the first variable impedance device 242 and the second variable impedance device 244, may provide additional isolation between the first DBD 182 and signals from and to the second DBD 184, essentially implementing the duplexer 100 of FIG. 10.

The second balun 202 includes a third set of coils 216, 220 and a fourth set of coils 218, 222. A fifth variable impedance device 248 is coupled to a first coil 216 of the third set of coils and a sixth variable impedance device 254 is coupled to a second coil 220 of the third set of coils. That is, the fifth variable impedance device 248 and the sixth variable impedance device 254 are coupled to opposite ends of the third set of coils 216, 220. Similarly, a seventh variable impedance device 250 is coupled to a third coil 218 of the fourth set of coils and an eighth variable impedance device 252 is coupled to a fourth coil 222 of the fourth set of coils. That is, the seventh variable impedance device 250 and the eighth variable impedance device 252 are coupled to opposite ends of the fourth set of coils 218, 222.

The second balun 202 may mitigate (or substantially prevent or reduce an occurrence of) a leakage signal from the first DBD 182 to the second isolation circuitry 190. Moreover, the second balun 202, in conjunction with the fifth variable impedance device 248 and the sixth variable impedance device 254, may provide isolation between the first DBD 182 and signals from and to the second DBD 184. The second balun 202, in conjunction with the seventh variable impedance device 250 and the eighth variable impedance device 252, may provide additional isolation between the first DBD 182 and signals from and to the second DBD 184.

The second isolation circuitry 190 includes a third balun 204 coupled in parallel to a fourth balun 206. The third balun 204 includes a first set of coils 224, 228 and a second set of coils 226, 230. A ninth variable impedance device 258 is coupled to a first coil 224 of the first set of coils and a tenth variable impedance device 260 is coupled to a second coil 228 of the first set of coils. That is, the ninth variable impedance device 258 and the tenth variable impedance device 260 are coupled to opposite ends of the first set of coils 224, 228. Similarly, an eleventh variable impedance device 256 is coupled to a third coil 226 of the second set of coils and a twelfth variable impedance device 262 is coupled to a fourth coil 230 of the second set of coils. That is, the eleventh variable impedance device 256 and the twelfth variable impedance device 262 are coupled to opposite ends of the second set of coils 226, 230.

The third balun 204, in conjunction with the eleventh variable impedance device 256 and the twelfth variable impedance device 262, may provide isolation between the second DBD 184 and signals from and to the first DBD 182. The third balun 204, in conjunction with the ninth variable impedance device 258 and the tenth variable impedance device 260, may provide additional isolation between the second DBD 184 and signals from and to the first DBD 182.

The fourth balun 206 includes a third set of coils 232, 236 and a fourth set of coils 234, 238. A thirteenth variable impedance device 264 is coupled to a first coil 232 of the third set of coils and a fourteenth variable impedance device 272 is coupled to a second coil 236 of the third set of coils. That is, the thirteenth variable impedance device 264 and the fourteenth variable impedance device 272 are coupled to opposite ends of the third set of coils 232, 236. Similarly, a fifteenth variable impedance device 268 is coupled to a third coil 234 of the fourth set of coils and a sixteenth variable impedance device 270 is coupled to a fourth coil 238 of the fourth set of coils. That is, the fifteenth variable impedance device 268 and the sixteenth variable impedance device 270 are coupled to opposite ends of the fourth set of coils 234, 238.

The fourth balun 206 may mitigate (or substantially prevent or reduce an occurrence of) a leakage signal from the second DBD 184 to the first isolation circuitry 188. Moreover, the fourth balun 206, in conjunction with the thirteenth variable impedance device 264 and the fourteenth variable impedance device 272 may provide isolation between the second DBD 184 and signals from and to the first DBD 182. The fifteenth variable impedance device 268 and the sixteenth variable impedance device 270 (in conjunction with the fourth balun 206) may provide additional isolation between the second DBD 184 and signals from and to the first DBD 182.

Similar to the variable impedance devices 152, 154, 156, 158, 160, 162, 164, 166 discussed with respect to FIG. 7, the impedances of the variable impedance devices 240, 242, 244, 246, 248, 250, 252, 254, 256, 258, 260, 262, 264, 266, 268, 270, 272 can be tuned such that each of the baluns 200, 202, 204, 206 are in a balanced state to improve isolation of the TX signal and TX signal leakage and the RX circuits 54 and isolation of the RX signal and the TX circuits 52. That is, the quadplexer 186 is similar to the isolation circuitry 58 discussed with respect to FIG. 5, with additional variable impedance devices coupled to the baluns 200, 202, 204, 206. That is, the quadplexer 186 is a combination of the isolation circuitry 58 of FIG. 5 and the duplexer 100 discussed with respect to FIG. 6. Thus, the quadplexer 186 provides improved isolation between the DBDs 182, 184 and increases bandwidth for wireless communications available to the electronic device 10.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. An electronic device comprising:
   one or more antennas;
   transmit circuitry configured to send a transmission signal to the one or more antennas;
   receive circuitry configured to receive a reception signal from the one or more antennas; and
   isolation circuitry configured to isolate the receive circuit from the transmission signal, the isolation circuitry comprising
      a first balun coupled between the one or more antennas and the receive circuitry,
      a first variable impedance device coupled to the first balun,
      a second variable impedance device coupled to the first balun,
      a second balun coupled to the one or more antennas and the transmit circuitry,
      a third variable impedance device coupled to the second balun, and
      a fourth variable impedance device coupled to the second balun.

2. The electronic device of claim 1, wherein the isolation circuitry is configured to isolate the receive circuitry from the transmission signal when the first variable impedance device and the second variable impedance device are in a balanced state.

3. The electronic device of claim 1, wherein the first variable impedance device and the second variable impedance device are coupled to opposing ends of a first set of coils of the first balun, and wherein the third variable impedance device and the fourth variable impedance device are coupled to opposing ends of a second set of coils of the first balun.

4. The electronic device of claim 3, wherein the receive circuitry is coupled to the first balun between the first set of coils, and wherein the transmit circuitry is coupled to the second balun between the second set of coils.

5. The electronic device of claim 1, comprising
   a fifth variable impedance device coupled to the first balun,
   a sixth variable impedance device coupled to the first balun,
   a seventh variable impedance device coupled to the second balun, and
   an eighth variable impedance device coupled to the second balun.

6. The electronic device of claim 5, wherein the first balun is configured to isolate the receive circuitry from the transmission signal when the fifth variable impedance device and the sixth variable impedance device are in a balanced state at a frequency of the transmission signal.

7. The electronic device of claim 1, wherein the isolation circuitry comprises
   a third balun coupled between one or more antennas and the receive circuitry configured to prevent a leakage current at a frequency of the transmission signal from entering the receive circuitry, and
   a fourth balun coupled to the one or more antennas and the transmit circuitry configured to isolate the transmit circuitry from the reception signal.

8. The electronic device of claim 1, wherein the first balun is disposed in parallel with the second balun.

9. Radio frequency transceiver circuitry comprising:
transmit circuitry communicatively coupled to one or more antennas, the transmit circuitry configured to send a transmission signal to the one or more antennas;
receive circuitry communicatively coupled to the one or more antennas, the receive circuitry configured to receive a reception signal from the one or more antennas; and
isolation circuitry comprising
a first balun transformer coupled between the one or more antennas and the receive circuitry,
a first set of variable impedance devices coupled to the first balun transformer, the first set of variable impedance devices configured to isolate the receive circuitry from the transmission signal when the first set of variable impedance devices are in a balanced state,
a second balun transformer coupled between the one or more antennas and the transmit circuitry, and
a second set of variable impedance devices coupled to the second balun transformer, the second set of variable impedance devices configured to isolate the transmit circuitry from the reception signal when the second set of variable impedance devices are in the balanced state.

10. The radio frequency transceiver circuitry of claim 9, wherein the first balun transformer comprises a first set of coils, the first set of variable impedance devices comprises first and second variable impedance devices coupled to opposing ends of the first set of coils, the second balun transformer comprises a second set of coils, and the second set of variable impedance devices comprises third and fourth variable impedance devices coupled to opposing ends of the second set of coils.

11. The radio frequency transceiver circuitry of claim 9, wherein the first set of variable impedance devices and the second set of variable impedance devices are configured to isolate the receive circuitry from the transmission signal when in the balanced state and enable the receive circuitry to receive the reception signal from the one or more antennas when in an unbalanced state.

12. The radio frequency transceiver circuitry of claim 9, wherein the reception signal is within a first frequency range, and the transmission signal is within a second frequency range.

13. The radio frequency transceiver circuitry of claim 12, wherein the first frequency range is greater than 100 megahertz (MHz) and the second frequency range is between 10 MHz and 100 MHz.

14. An electronic device comprising:
one or more antennas;
first isolation circuitry coupled to the one or more antennas, the first isolation circuitry comprising a first balun coupled to the one or more antennas and a first set of variable impedance devices;
a first duplexer coupled to the first balun;
second isolation circuitry coupled to the one or more antennas, the second isolation circuitry comprising a second balun coupled to a second set of variable impedance devices; and
a second duplexer coupled to the second balun.

15. The electronic device of claim 14, wherein the first isolation circuitry comprises
a third balun coupled to the one or more antennas and a third set of impedance devices, the first duplexer coupled to the third balun.

16. The electronic device of claim 15, wherein the second isolation circuitry comprises
a fourth balun coupled to the one or more antennas and a fourth set of impedance devices, the second duplexer coupled to the fourth balun.

17. The electronic device of claim 16, the first duplexer comprising
a first plurality of variable impedance devices coupled to opposing ends of a first set of coils of the first balun, and
a second plurality of variable impedance devices coupled to opposing ends of a second set of coils of the second balun.

18. The electronic device of claim 14, wherein the first balun is coupled in parallel with the second balun.

19. The electronic device of claim 14, wherein the first duplexer comprises
a third balun coupled to the one or more antennas and receive circuitry, the receive circuitry configured to receive a reception signal from the one or more antennas, and
a fourth balun coupled to the one or more antennas and transmit circuitry, the transmit circuitry configured to send a transmission signal to the one or more antennas.

20. The electronic device of claim 19, wherein the second duplexer comprises
a fifth balun coupled to the one or more antennas and the receive circuitry,
a first plurality of variable impedance devices coupled to the fifth balun,
a sixth balun coupled to the one or more antennas and the transmit circuitry, and
a second plurality of variable impedance devices coupled to the sixth balun.

* * * * *